United States Patent [19]
Tanaka

[11] Patent Number: 6,134,169
[45] Date of Patent: Oct. 17, 2000

[54] SEMICONDUCTOR MEMORY DEVICE

[75] Inventor: Hidehiko Tanaka, Nara-ken, Japan

[73] Assignee: Sharp Kabushiki Kaisha, Japan

[21] Appl. No.: 09/447,095

[22] Filed: Nov. 22, 1999

[30] Foreign Application Priority Data

Nov. 24, 1998 [JP] Japan .................................. 10-333312

[51] Int. Cl.[7] .................................................. G11C 11/34
[52] U.S. Cl. ...................................... 365/222; 365/189.04
[58] Field of Search .................................... 365/222–236, 365/207, 189.04

[56] References Cited

U.S. PATENT DOCUMENTS

| | | | |
|---|---|---|---|
| 4,161,040 | 7/1979 | Satoh | 365/203 |
| 5,511,033 | 4/1996 | Jung | 365/222 |

FOREIGN PATENT DOCUMENTS

| | | |
|---|---|---|
| 7-122062 | 5/1995 | Japan . |
| 7-226077 | 8/1995 | Japan . |
| 8-077769 | 3/1996 | Japan . |
| 9-139074 | 5/1997 | Japan . |

*Primary Examiner*—A. Zarabian
*Attorney, Agent, or Firm*—Morrison & Foerster LLP

[57] ABSTRACT

In a semiconductor memory device of the present invention, a read operation is performed by activating a first word line of the plurality of word lines, transferring data read out from the memory cells simultaneously selected by the first word line via the plurality of bit line groups, latching the data from the plurality of bit line groups in the plurality of first sense amplifiers via the first switch section, transferring data from one of the plurality of first sense amplifiers to the first common data line via one of the plurality of third switch sections, and outputting the data from the first common data line to an external unit. A refresh operation is performed, simultaneously with the read operation, by activating a second word line of the plurality of word lines, and refreshing data read out from the memory cells simultaneously selected by the second word line using the plurality of second sense amplifiers via the second switch section.

5 Claims, 6 Drawing Sheets

SEMICONDUCTOR MEMORY DEVICE

BACKGROUND OF THE INVENTION

1. Field of the Invention

The present invention relates to a dynamic semiconductor memory device and, more particularly, to a synchronous DRAM.

2. Description of the Related Art

As a memory LSI which reduces or eliminates an access gap between a microprocessor and a memory, a synchronous memory has recently been proposed. A synchronous memory performs an input/output operation in synchronization with an external clock and thus has an increased data transfer rate.

Figure 4:
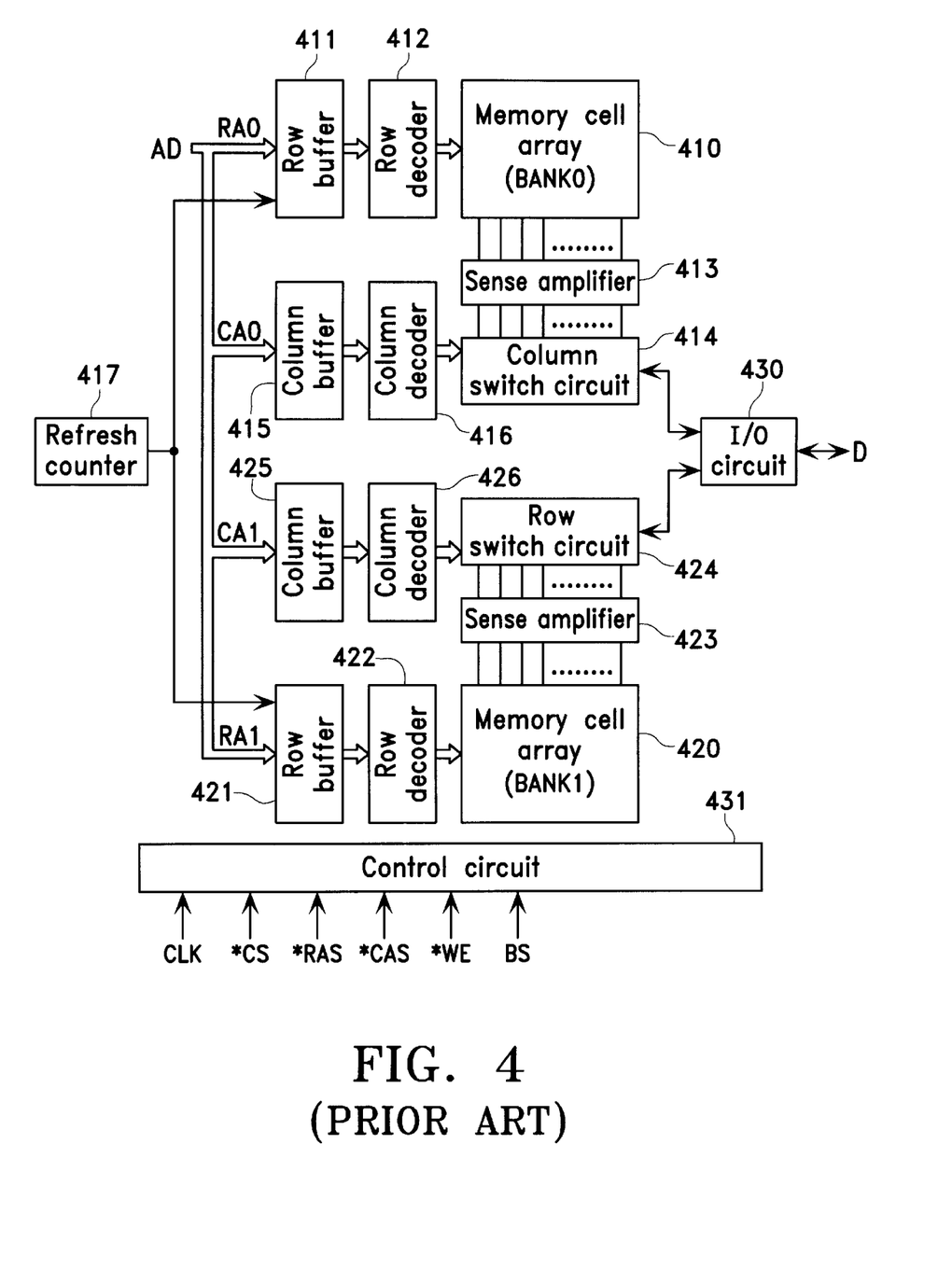
FIG. 4 is a block diagram illustrating a configuration of a conventional synchronous DRAM.

A synchronous DRAM (hereinafter, "SDRAM") is one type of such synchronous memories. FIG. 4 is a block diagram illustrating a conventional synchronous DRAM.

The SDRAM performs a command setting operation and an input/output operation in synchronization with a rising edge of an externally supplied clock CLK. While the access time of an SDRAM for a first data point is substantially the same as that of a non-synchronous DRAM, an SDRAM is capable of reading a second and subsequent data points at a higher speed (e.g., a data point per clock cycle). The SDRAM includes a memory cell array 410 for a bank BANK0 and another memory cell array 420 for another bank BANK1. Data can be read out alternately in blocks of four words from the memory cell array 410 and from the memory cell array 420, for example, while effectively eliminating a precharge period and accessing different row addresses without an interruption.

Figure 5:
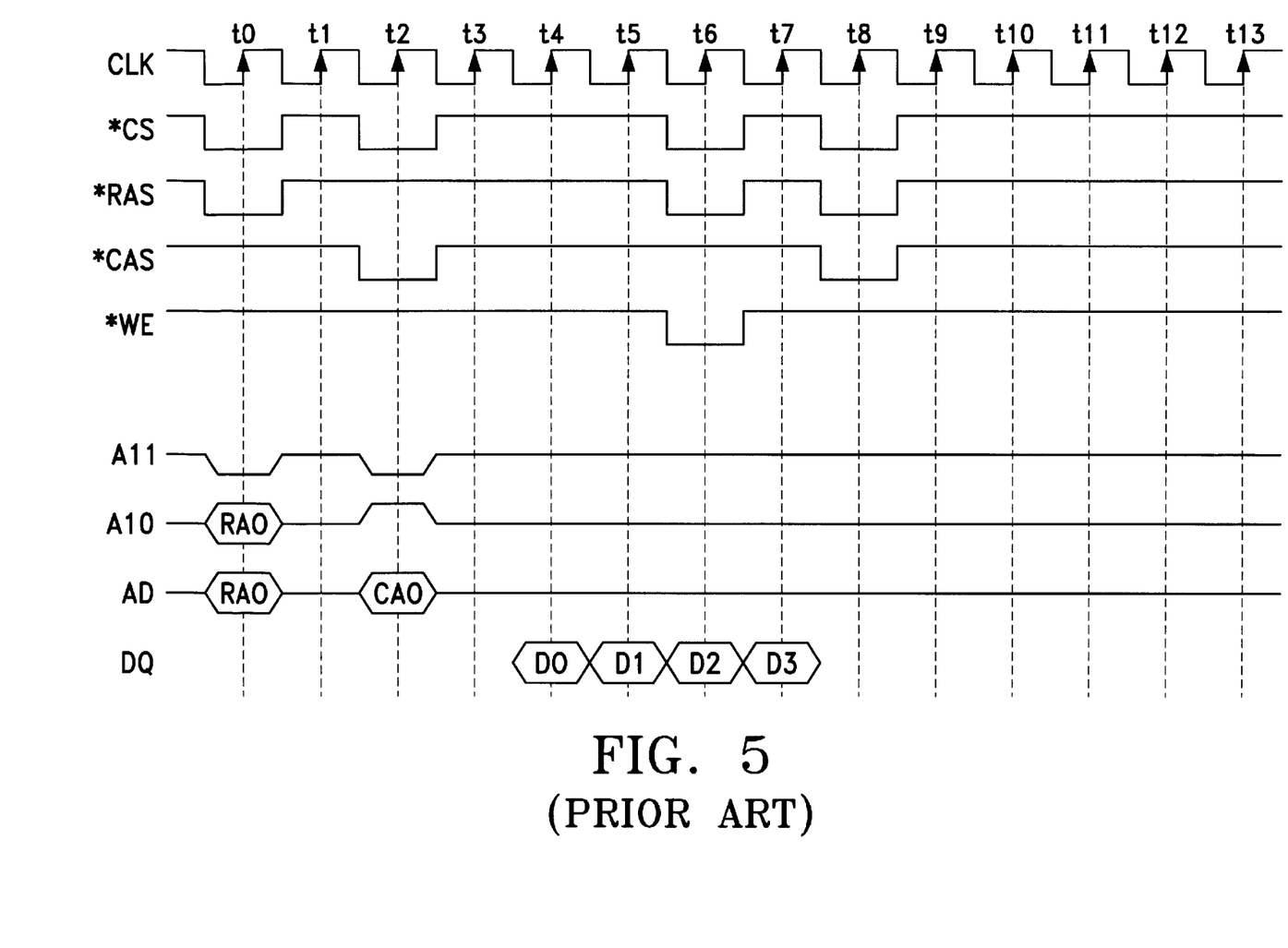
FIG. 5 is a timing diagram illustrating an exemplary operation of a conventional synchronous DRAM.

The SDRAM has two modes of refresh operations, i.e., an auto-refresh operation and a self-refresh operation. FIG. 5 is a timing diagram illustrating a read/write operation and an auto-refresh operation of the SDRAM. FIG. 5 illustrates such operations compliant with a JEDEC (Joint Electron Device Engineering Council) standard where the burst length is 4 and the CAS latency is 2. An operation of the conventional SDRAM will be described below with reference to FIGS. 4 and 5.

The bit lines of the memory cell array 410 are precharged before time t0. In the following description, a designation such as "(t0)" refers to a series of operations which starts at time t0.

(t0)

At time t0, a chip select signal *CS and a row address strobe signal *RAS are at a low level, and a column address strobe signal *CAS and a write enable signal *WE are at a high level, thereby initiating an active operation. In particular, an address input signal AD is stored in a row address buffer 411 as a row address RA0. The row address RA0 is decoded by a row decoder 412, and one of the word lines in the memory cell array 410 is selected so as to read out the contents of a row of memory cells onto the bit lines. Then, data on each bit line is amplified by a sense amplifier 413.

(t2)

At time t2, the chip select signal *CS and the column address strobe signal *CAS are at a low level, and the row address strobe signal *RAS and the write enable signal *WE are at a high level, thereby initiating a read operation. In particular, an address input signal AD is stored in a column address buffer 415 as a column address CA0. The column address CA0 is decoded by a column decoder 416, whereby data D0 on a bit line which is selected according to the output from the column decoder 416 is supplied to an input/output circuit 430 via a column switch circuit 414. The data D0 is stored in, and then output from, a latch circuit in the input/output circuit 430.

(t4)

At time t4, the data D0 output from the DRAM is read by an external unit. A clock is supplied to a column address counter (not shown) in the column address buffer 415 so as to increment the column address. Data D1 on another bit line which is selected according to the column address is supplied to the input/output circuit 430 via the column switch circuit 414. The data D1 is stored in, and then output from, a latch circuit in the input/output circuit 430. Thereafter, substantially the same operation as that at time t4 is repeated until time t7. Thus, consecutive four words of data, i.e., the data D0 to D3, are output from the input/output circuit 430 during the period t4–t7.

(t6)

At time t6, the bit lines of the memory cell array 410 are precharged in preparation for the next access. In particular, at time t6, the chip select signal *CS, the row address strobe signal *RAS and the write enable signal *WE are at a low level, and the column address strobe signal *CAS is at a high level, thereby initiating a precharge operation.

(t8)

At time t8, the chip select signal *CS, the row address strobe signal *RAS and the column address strobe signal *CAS are at a low level, and the write enable signal *WE is at a high level, thereby initiating an auto-refresh operation. In the auto-refresh operation, a refresh address is produced by an internal refresh counter 417 so as to refresh a row of memory cells corresponding to the refresh address. In particular, the refresh address is stored in the row address buffer 411 and decoded by the row decoder 412, and one of the word lines in the memory cell array 410 is selected so as to read out the contents of a row of memory cells onto the bit lines. Then, data on each bit line is amplified by the sense amplifier 413 and re-written in one of the memory cells along the row. Then, the bit lines are automatically precharged. Each time an auto-refresh operation is performed, the refresh address output from the internal refresh counter 417 is updated. Thus, memory cells of new row addresses are successively refreshed.

According to the above-described refresh method compliant with a JEDEC standard, a plurality of memory banks are alternately refreshed. The memory banks cannot be refreshed simultaneously with a read/write operation.

A technique for refreshing different memory banks independently from and simultaneously with a memory access operation is disclosed in, for example, Japanese Laid-Open Publication Nos. 7-226077, 8-77769 and 9-139074.

Figure 6:
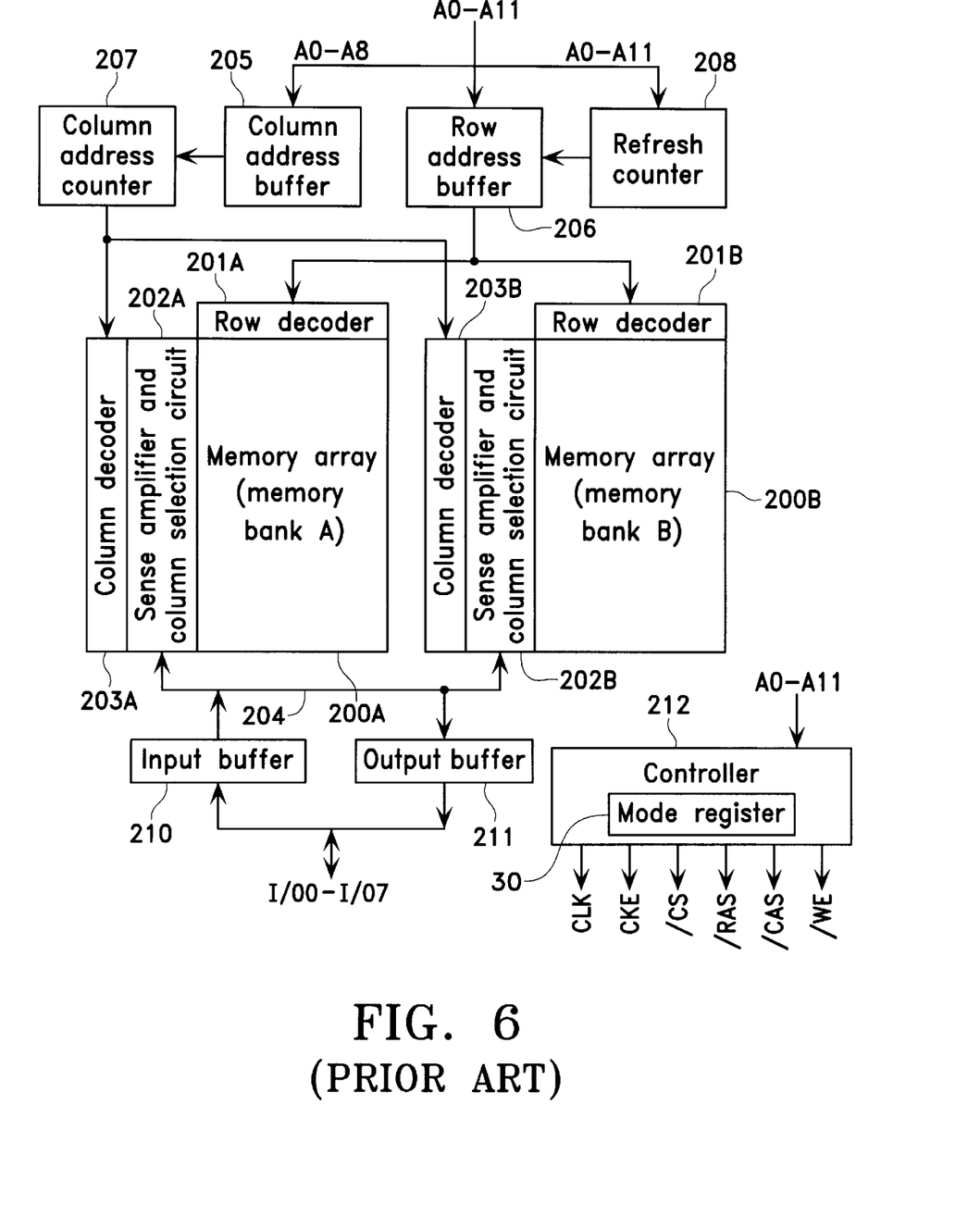
FIG. 6 is a block diagram illustrating another configuration of a conventional synchronous DRAM.

FIG. 6 is a block diagram (FIG. 1 of Japanese Laid-Open Publication No. 9-139074) illustrating an SDRAM according to an example disclosed in Japanese Laid-Open Publication No. 9-139074. The SDRAM includes a memory cell array 200A forming a memory bank A and another memory cell array 200B forming another memory bank B. Each of the memory cell arrays 200A and 200B includes dynamic memory cells arranged in a matrix. Each memory cell includes a capacitor for storing data and a MOS transistor. The gate of the MOS transistor is coupled to a word line (not shown) and the drain thereof is connected to a complementary bit line (not shown).

In the memory cell array 200A, one of a plurality of word lines is driven to a selected level according to the results of a decoding operation on the row address signal by a row decoder 201A. The complementary bit line (not shown) of the memory cell array 200A is coupled to a sense amplifier/column selection circuit 202A. A sense amplifier in the sense amplifier/column selection circuit 202A is an amplifier circuit for detecting and amplifying a small potential difference which appears on each complementary bit line when reading out data from a memory cell. A column switch circuit in the sense amplifier/column selection circuit 202A is a switch circuit for individually selecting a complementary bit line and electrically connecting the selected complementary bit line to a complementary common bit line 204. The column switch circuit is selectively operated based on the results of a decoding operation on a column address signal supplied from a column decoder 203A.

Similarly, the memory cell array 200B includes a row decoder 201B, a sense amplifier and column selection circuit 202B and a column decoder 203B. The complementary common bit line 204 is connected to an output terminal of an input buffer 210 and to an input terminal of an output buffer 211. The input terminal of the input buffer 210 and the output terminal of the output buffer 211 are connected to 8 bits of data input/output terminals I/O 0–I/O 7.

A row address signal and a column address signal supplied from address input terminals A0–A11 are received by a column address buffer 205 and a row address buffer 206, respectively, in an address multiplexed manner. The supplied address signals are stored in the respective buffers. In a refresh operation mode, the row address buffer 206 receives a refresh address signal output from a refresh counter 208 as a row address signal. The output of the column address buffer 205 is supplied as preset data of a column address counter 207. The column address counter 207 outputs, to the column decoders 203A and 203B, either the column address signal as the preset data or a value obtained by successively incrementing the column address signal, according to the operation mode being specified by a command.

A controller 212 receives an external control signal (such as a clock signal CLK, a clock enable signal CKE, a chip select signal CS bar, a column address strobe signal CAS bar, a row address strobe signal RAS bar, a write enable signal WE bar, and a data input/output mask control signal DQM) and control data from the address input terminals A0–A11. The signals which may be supplied to the controller 212 are not limited to the above. The controller 212 produces an internal timing signal for controlling the operation mode of the SDRAM and the operation of the above-described circuit blocks, based on a change in level of these signals and the timing thereof. For this operation, the controller 212 includes a control logic (not shown) and a mode register 30.

The clock signal CLK is used as a master clock for the SDRAM. The other externally input signals are latched in synchronization with a rising edge of the internal clock signal CLK. The chip select signal CS bar indicates, by its low level, a start of a command input cycle. The signals RAS bar, CAS bar and WE bar have different functions than those of the corresponding signals used in an ordinary DRAM, and they are used when setting a command cycle. The clock enable signal CKE is a signal which indicates a validity of the next clock signal. The rising edge of the next clock signal CLK is assumed to be valid when the signal CKE is at a high level, and invalid when it is at a low level. Although not shown In the figure, the controller 212 also receives an external control signal for performing an output enable control for the output buffer 211 in a read mode. For example, the output buffer 211 has a high output impedance when this signal is at a high level.

The row address signal is defined by the respective levels at the address input terminals A0–A10 during a bank active command cycle which starts in synchronization with a rising edge of the clock signal CLK (internal clock signal). The input at the address input terminal A11 is considered as a bank selection signal during the bank active command cycle. In particular, the memory bank A and the memory bank B may be selected when the input at the address input terminal A11 is low and high, respectively.

The selection between/among memory banks can be performed by various methods including, but are not limited to: activating only the row decoder of the selected memory bank; unselecting all of the column switch circuits of the non-selected memory bank; and connecting only the selected memory bank to the input buffer 210 and to the output buffer 211.

The input at the address input terminal A10 during a precharge command cycle indicates the mode of precharge operation for a complementary bit line, or the like. The input at the terminal A10 being at a high level indicates that both memory banks are to be precharged, whereas the input at the terminal A10 being at a low level indicates that only one of the memory banks specified by the input at the terminal A11 is to be precharged.

The column address signal is defined by the respective levels at the address input terminals A0–A8 during a read or write command cycle (i.e., the cycle of a column address read command or a column address write command to be described later) which starts in synchronization with a rising edge of the clock signal CLK (internal clock signal). The column address defined as described above is used as a start address for a burst access operation.

The SDRAM has two different refresh commands as follows.

(1) Refresh Command 1

Refresh command 1 is a command which is required to start an auto-refresh operation. Refresh command 1 is issued when the signals CS bar, RAS bar and CAS bar are at a low level while the signals WE bar and CKE are at a high level. This auto-refresh command 1 simultaneously refreshes the two memory cell arrays 200A and 200B (the memory banks A and B) at once.

(2) Refresh Command 2

Refresh command 2 is a command which is required to start an auto-refresh operation for each memory bank. Unlike refresh command 1, refresh command 2 is issued, for example, when the signals CS bar, RAS bar, CAS bar, WE bar and CKE are at a low level. This auto-refresh command 2 references a particular bit in the mode register 30. For example, the memory cell array 200A is refreshed when the bit is "0", whereas the memory cell array 200B is refreshed when the particular bit is "1". Alternatively, the memory cell array 200A may be refreshed when the signal DQM, for example, is at a low level, while refreshing the memory cell array 200B when the signal DQM is at a high level.

In a refresh operation for an SDRAM as illustrated in FIG. 6, only a row address selection is performed. In particular, an address signal produced by the refresh counter 208, instead of the external address signal, is received by the row address buffer 206. Then, when refresh command 1 as described above is input, a word line selection operation and a sense amplification operation are performed for both of the memory cell arrays 200A and 200B. In particular, data stored in a dynamic memory cell which is connected to a selected word line in each of the two memory cell arrays 200A and 200B is sensed and amplified by the sense amplifier, and the amplified data is re-written in the same memory cell (i.e., refreshed). Alternatively, when refresh command 2 as described above is input, a word line selection operation and a sense amplification operation are performed for one of the memory cell arrays 200A and 200B which is specified by the signal DQM or the mode register.

While the memory cell array 200A (memory bank A), for example, is being refreshed in response to refresh command 2, a read/write operation may be performed for the other memory cell array 200B (memory bank B) in response to another command. For example, in the burst mode as described above, if the word line selection operation for the memory cell array 200B (memory bank B) has already been completed, a read/write operation is performed according to the address which is produced by the column address counter 207 provided in the memory cell array 200B.

However, according to the above-described conventional refresh method compliant with a JEDEC standard, a plurality of memory banks are alternately refreshed, and the memory banks cannot be refreshed simultaneously with a read/write operation. This is because it is not possible to externally control which bank is refreshed. Moreover, when a refresh operation is performed simultaneously with a read/write operation for the same bank, data from one row may collide with data from another row, thereby losing the data.

Japanese Laid-Open Publication Nos. 7-226077 and 8-77769 disclose a refresh method in which a particular bank can be specified. According to this refresh method, it is possible to perform a refresh operation for one bank while simultaneously performing an access operation such as a read/write operation for another bank. However, for the same reason as described above, a bank cannot be refreshed while a read/write operation is simultaneously performed for the same bank.

SUMMARY OF THE INVENTION

According to one aspect of this invention, a semiconductor memory device of the present invention includes: a plurality of memory cells; a plurality of word lines controlled by an output of a row decoder for selecting some of the plurality of memory cells; a plurality of bit line groups for transferring data read out from the memory cells which are simultaneously selected by each of the plurality of word lines; a plurality of first sense line groups connected respectively to the plurality of bit line groups via a first switch section; a plurality of second sense line groups connected respectively to the plurality of bit line groups via a second switch section; a plurality of first sense amplifiers connected respectively to the plurality of first sense line groups; a plurality of second sense amplifiers connected respectively to the plurality of second sense line groups; a plurality of third switch sections which are connected respectively to the plurality of first sense line groups and controlled by an output of a column decoder; a first common data line connected to the plurality of third switch sections; an input/output circuit connected to the first common data line for inputting/outputting data from/to an external unit; and a control circuit for controlling the plurality of third switch sections so as to transfer data latched by the plurality of first sense amplifiers to the input/output circuit via the first common data line. A read operation is performed by activating a first word line of the plurality of word lines, transferring data read out from the memory cells simultaneously selected by the first word line via the plurality of bit line groups, latching the data from the plurality of bit line groups in the plurality of first sense amplifiers via the first switch section, transferring data from one of the plurality of first sense amplifiers to the first common data line via one of the plurality of third switch sections, and outputting the data from the first common data line to an external unit. A refresh operation is performed, simultaneously with the read operation, by activating a second word line of the plurality of word lines, and refreshing data read out from the memory cells simultaneously selected by the second word line using the plurality of second sense amplifiers via the second switch section.

In one embodiment of the invention, the first switch section is conductive and the second switch section is non-conductive at a point in time when the first word line is selected. After the first word line is selected, only the plurality of first sense amplifiers are activated which are connected to the plurality of first sense line groups connected to the plurality of bit line groups via the first switch section being conductive so as to amplify a potential difference between the plurality of first sense line groups and the bit line groups, thereby latching data in the plurality of first sense amplifiers. While the data is latched in the plurality of first sense amplifiers, the first word line is unselected and data is re-written in the memory cells, the first switch section and the second switch section are turned to be non-conductive, the plurality of bit line groups separated from the plurality of first sense amplifiers and the plurality of second sense amplifiers are precharged, and the data is read out from the plurality of first sense amplifiers to the first common data line via the plurality of third switch sections, thus performing a read operation. Simultaneously with the read operation, the second switch section is turned to be conductive and a precharge circuit coupled to the bit line groups is activated so as to automatically precharge the plurality of bit line groups and the plurality of second sense line groups connected to the bit line groups. At a point in time when the second word line is selected, the first switch section is non-conductive and the second switch section is turned to be conductive, so that a potential difference between the plurality of first sense line groups connected to the second switch section and the bit line groups is amplified by the plurality of second sense amplifiers, thereby re-writing the data in the memory cells, after which the second word line is unselected.

In one embodiment of the invention, the semiconductor memory device further includes an internal refresh counter for outputting a refresh address. The first word line is selected based on an externally input row address. The second word line is selected based on the refresh address output from the internal refresh counter.

In one embodiment of the invention, the externally input row address and the refresh address output from the internal refresh counter are compared with each other. If the addresses do not coincide with each other, the second word line is selected based on the refresh address. If the addresses coincide with each other, the refresh address is updated, and then the second word line is selected based on the updated refresh address.

In one embodiment of the invention, the plurality of second sense line groups are connected to the second common data line via a fourth switch section. The semiconductor memory device further includes a control circuit for controlling the fourth switch section so that data latched in the plurality of second sense amplifiers is output to the external unit via the second common data line.

Functions of the present invention will be described below.

In a semiconductor memory device of the present invention, a plurality of bit line groups are connected respectively to a plurality of first sense line groups via a first switch section, and respectively to a plurality of second sense line groups via a second switch section. The plurality of first sense line groups are connected respectively to a plurality of first sense amplifiers, and the plurality of second sense line groups are connected respectively to a plurality of second sense amplifiers. By controlling the first switch section and the second switch section independently from each other, it is possible to simultaneously perform a read operation and a refresh operation. In particular, a read operation can be performed by: latching, with the first sense amplifiers, data read out from memory cells which are simultaneously selected by a first activated word line; transferring the latched data to a first common data line; and then outputting the data from the first common data line to an external unit. Simultaneously with the read operation, a refresh operation can be performed by: amplifying, with the second sense amplifiers, data read out from memory cells which are simultaneously selected by a second activated word line; and then re-writing the data in the memory cells which are simultaneously selected by the second activated word line.

An internal refresh counter for outputting a refresh address may further be provided, so that a word line can be selected based on an externally input row address while selecting another word line based on a refresh address output from the internal refresh counter. With such a configuration, it is possible to prevent a refresh operation of the same row address in one bank from being performed repeatedly.

More specifically, the externally input row address can be compared with the refresh address output from the internal refresh counter. Then, if the addresses do not coincide with each other, a second word line can be selected based on the refresh address. If the addresses coincide with each other, the refresh address can be updated and the second word line can be selected based on the updated refresh address. Thus, a refresh operation will not be performed repeatedly for the same row address.

The second sense line groups may be connected to the second common data line via a fourth switch section. The fourth switch section can be controlled so that data latched by the second sense amplifiers is externally output via the second common data line. With such a configuration, the second sense amplifiers can be used for a read operation as well as for a refresh operation.

Thus, the invention described herein makes possible the advantage of providing a semiconductor memory device in which it is possible to simultaneously perform an access operation and a refresh operation for the same bank.

This and other advantages of the present invention will become apparent to those skilled in the art upon reading and understanding the following detailed description with reference to the accompanying figures.

DESCRIPTION OF THE PREFERRED EMBODIMENTS

Figure 1:
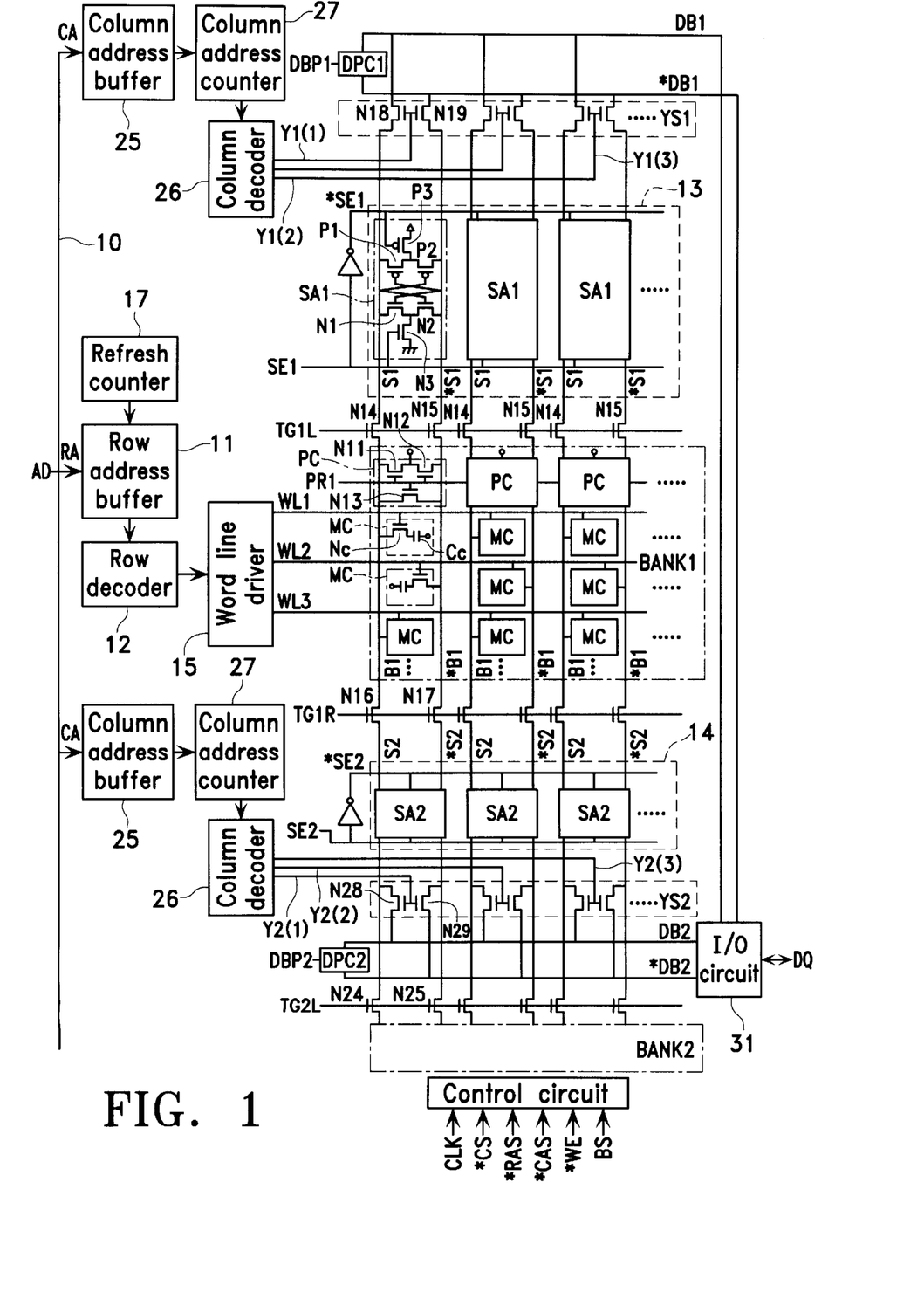
FIG. 1 is a block diagram illustrating a configuration of a synchronous DRAM according to an example of the present invention.

FIG. 1 is a schematic diagram illustrating a synchronous DRAM according to the present invention. The synchronous DRAM includes a memory cell array of a bank BANK1 and another memory cell array of another bank BANK2 having substantially the same configuration as that of BANK1. BANK1 and BANK2 can be independently operated in substantially the same manner, and thus only BANK1 will be discussed below.

An address AD on an address bus 10 is first stored in a row address buffer 11 as a row address RA. The stored row address RA is then decoded by a row decoder 12 so that one of the word lines in the memory cell array is selected by a word line driver 15. The address AD is also stored in a column address buffer 25 as a column address CA. The stored column address CA is then input to a column address counter 27. The column address counter 27 counts up (or increments) the column address CA for every clock cycle, thereby outputting a column address. The column address is decoded by a column decoder 26, and a column selection signal Y1(j) is output.

In BANK1, each memory cell MC includes a MOS capacitor Cc and an nMOS transistor Nc. One end of the MOS capacitor Cc is connected to a ground line, and the other end thereof is connected to one of a group of bit lines (B1, *B1) via the nMOS transistor Nc. The gate of the nMOS transistor NC is connected to one of a group of wordlines (WL1, WL2, ... ). Herein, a group of equivalent elements are denoted by reference characters in parentheses.

Each group of bit lines (B1, *B1) is connected to a precharge circuit PC including nMOS transistors N11, N12 and N13. In the precharge circuit PC, each bit line B1 and *B1 is connected at one end to a power supply line having a potential of Vcc/2 via the nMOS transistors N11 and N12, respectively. The equalizer nMOS transistor N13 is connected between the bit lines B1 and *B1. A precharge signal PR1 is input to the gate of each of the nMOS transistors N11, N12 and N13.

Each group of bit lines (B1, *B1) is connected to a group of sense lines (S1, *S1) via a group of nMOS transistors (N14, N15) and to another group of sense lines (S2, *S2) via another group of nMOS transistors (N16, N17).

A transfer gate signal TG1L is input to the gates of the group of nMOS transistors (N14, N15), and another transfer gate signal TG1R is input to the gates of the group of nMOS transistors (N16, N17). Each of the transfer gate signals TG1R and TG1L is at a boosted level obtained by internally increasing the power supply potential Vcc.

Sense amplifiers SA1 and SA2 are connected between the group of sense lines (S1, *S1) and between the group of sense lines (S2, *S2), respectively. The sense amplifiers SA1 and SA2 have substantially the same configuration, each including nMOS transistors N1, N2 and N3 and pMOS transistors P1, P2 and P3. The sense amplifier SA1 or SA2 is an element for fully swinging an input voltage between the power supply potential Vcc and a ground potential GND by amplifying a potential difference between the sense line S1 and the sense line *S1. A sense amplifier drive signal SE1 and an inverted sense amplifier drive signal *SE1 are input to the gate of the nMOS transistor N3 and the gate of the pMOS transistor P3, respectively, in the sense amplifier SA1. Another sense amplifier drive signal SE2 and another inverted sense amplifier drive signal *SE2 are input to the gate of the nMOS transistor N3 and the gate of the pMOS transistor P3, respectively, in the sense amplifier SA2.

The group of sense lines (S1, *S1) is connected to a group of common data lines (DB1, *DB1) via a column switch circuit YS1 which includes nMOS transistors N18 and N19. The gates of the nMOS transistors N18 and N19 are commonly connected to the column selection signal Y1(j). The group of sense lines (S2, *S2) is connected to another group of common data lines (DB2, *DB2) via another column switch circuit YS2 which includes nMOS transistors N28 and N29. The gates of the nMOS transistors N28 and N29 are commonly connected to another column selection signal Y2(j).

The above-described precharge circuit PC, the sense amplifiers SA and the column switch circuits YS are configured in substantially the same manner for different columns of the memory cell array. A common data line precharge circuit DPC1 is connected between the group of common data lines (DB1, *DB1). A common data line precharge signal DBP1 is input to the common data line precharge circuit DPC1. Another common data line precharge circuit DPC2 is connected between the group of common data lines (DB2, *DB2). Another common data line precharge signal DBP2 is input to the common data line precharge circuit DPC2.

In the configuration illustrated in FIG. 1, the group of sense amplifiers SA2, the group of sense lines (S2, *S2), the group of common data lines (DB2, *DB2) and the column switch circuit YS2 including the nMOS transistors N28 and N29 are shared by BANK1 and BANK2. Alternatively, BANK2 may have these elements separately from BANK1. Moreover, while the group of sense lines (S2, *S2) is connected to the group of common data lines (DB2, *DB2) via the column switch circuit YS2 in the illustrated configuration, the group of common data lines (DB2, *DB2) and the column switch circuit YS2 may be optional when the group of sense lines (S2, *S2) is used only for refresh operations.

Furthermore, while two banks are provided in the illustrated example, the number of banks is not limited to two, but the number of banks can easily be increased to three or more. When three or more banks are provided, each bank is preferably connected to two groups of sense amplifiers and two groups of sense lines via transfer gates, wherein each group of sense lines is connected to a respective group of common data lines via a column switch.

The common data lines DB1, *DB1, DB2 and *DB2 are connected to an input/output circuit 31. Although not shown in FIG. 1, the input/output circuit 31 includes a circuit for multiplexing these common data lines, a read amplifier for amplifying a potential difference between the common data lines DB and *DB, a read data line for transferring an output of the read amplifier, and a latch for holding data on the read data line.

A control circuit, as in the prior art, includes a mode register and is capable of setting a burst length, a lap type, and a CAS latency. The control circuit controls the elements of the memory access circuit (not shown) based on the externally supplied clock CLK, the chip select signal *CS, the row address strobe signal *RAS, the column address strobe signal *CAS and the write enable signal *WE. The control circuit outputs a series of control signals in response to a rising edge of the clock CLK while the chip select signal *CS is at a low level.

When the row address strobe signal *RAS is at a low level and the column address strobe signal *CAS is at a high level, the address AD is stored in the row address buffer 11 at a rising edge of the clock CLK, followed by a data read operation onto a bit line and an amplification operation by a group of sense amplifiers 13.

When the row address strobe signal *RAS is at a high level and the column address strobe signal *CAS is at a low level, the address AD is stored in the column address buffer 25 at a rising edge of the clock CLK, followed by a read operation or a write operation of data on a bit line according to whether the write enable signal *WE is at a high level or at a low level.

The control circuit performs a control operation according to the JEDEC standard, and performs an auto-precharge operation when the chip select signal *CS, the row address strobe signal *RAS and the column address strobe signal *CAS are all at a low level.

Figure 2:
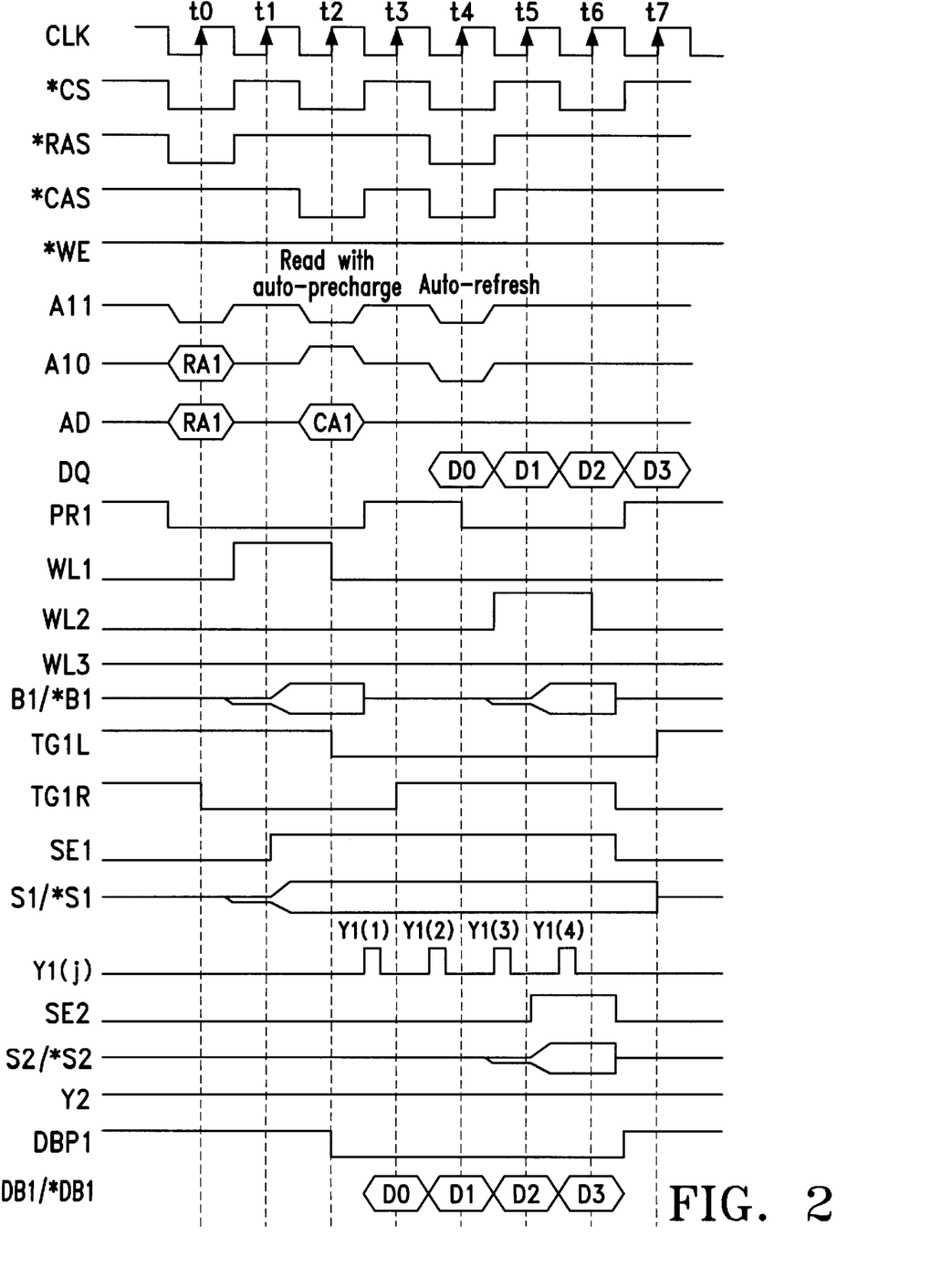
FIG. 2 is a timing diagram illustrating an exemplary operation of a synchronous DRAM according to an example of the present invention.

Referring now to FIG. 2, an exemplary operation of the synchronous DRAM of the present invention will be described below. FIG. 2 illustrates an operation of the synchronous DRAM of the present invention where the burst length is 4 and the CAS latency is 2.

In particular, an operation of reading out data from the first row of BANK1 while simultaneously auto-refreshing data in the same bank (BANK1) will be described below.

Before time t0, the precharge signal PR1 and the transfer gate signals TG1L and TG1R are at a high level, and the group of bit lines (B1, *B1), the group of sense lines (S1, *S1) and the group of sense lines (S2, *S2) are all precharged to a potential of Vcc/2. In the following description, a designation such as "(t0)" refers to a series of operations which starts at time t0.

(t0)

At time t0, the chip select signal *CS, the row address strobe signal *RAS and an address signal A11 are at a low level, and the column address strobe signal *CAS is at a high level, thereby initiating an active operation for BANK1. The precharge signal PR1 and the transfer gate signal TG1R go low, whereby a precharge on the group of bit lines (B1, *B1), the group of sense lines (S1, *S1) and the group of sense lines (S2, *S2) is released so that these lines start floating, whereby the group of bit lines (B1, *B1) and the group of sense lines (S2, *S2) are separated from each other.

The address AD is stored in the row address buffer 11 as a row address RA1, and the word line WL1 selected by the row decoder 12 goes high. The "high level" as used herein refers to a boosted level obtained by increasing the power supply potential Vcc. The respective charges stored in the memory cell capacitors are transferred to the group of bit lines (B1, *B1) and the group of sense lines (S1, *S1), whereby a small potential difference occurs between the bit lines B1 and *B1 of the group of bit lines (B1, *B1) and between the sense line S1 and *S1 of the group of sense lines (S1, *S1).

(t1)

Then, the sense amplifier drive signal SE1 goes high, thereby activating the group of sense amplifiers 13. Thus, the data on the group of sense lines (S1, *S1) and the group of bit lines (B1, *B1) is amplified by the group of sense amplifiers 13, thereby storing a row of data on the bit lines.

The row of data is also written in the memory cells along the word line WL1.

(t2)

At time t2, the chip select signal *CS, the column address strobe signal *CAS and the address signal A11 are at a low level, and the row address strobe signal *RAS, the write enable signal *WE and the address signal A10 are at a high level, thereby performing a burst read operation with auto-precharge as follows on four words of data (1 word=1 bit in this example) from the group of sense amplifiers 13 since the burst length is 4.

First, the word line WL1 goes low, and data on the group of bit lines (B1, *B1) is stored and held in the group of memory cells along the word line WL1. Then, the transfer gate signal TG1L goes low, and the group of nMOS transistors (N14, N15) are turned OFF, whereby the group of bit lines (B1, *B1) and the group of sense lines (S1, *S1) are separated from each other. The common data line precharge signal DBP1 goes low, thereby releasing the precharge on the group of common data lines (DB1, *DB1). Herein, the CAS latency is 2. Thus, the address AD is latched by the column address buffer 25 as a column address CA, and the first column address output from the column address counter 27 is selected by the column decoder 26, whereby a column selection signal Y1(1) goes high so as to transfer the data on the group of sense lines (S1, *S1) to the common data lines DB1 and *DB1. Then, the column selection signal Y1(1) returns to a low level.

The data on the common data lines DB1 and *DB1 is amplified by a read amplifier (not shown) provided in the input/output circuit 31 and output to a read data line (not shown).

In preparation for the next operation for the memory cell array in BANK1, BANK1 performs an auto-precharge operation. The precharge signal PR1 is raised to a high level in order to precharge the group of bit lines in BANK1. Thus, the group of bit lines (B1, *B1) is precharged to a potential of Vcc/2.

(t3)

The first data on the read data line is latched by a read latch, and then is output to a DQ output terminal. In preparation for an input of another row address in BANK1, the transfer gate signal TG1R is raised to a high level to precharge the group of sense lines (S2, *S2). Simultaneously, the column address counter 27 counts up the column address so as to produce a second column address. Thus, a column selection signal Y1(2) selected by the second column address goes high, thereby transferring the second data on the group of sense lines (S1, *S1) to the group of common data lines (DB1, *DB1). Then, the column selection signal Y1(2) returns to a low level. Although the column selection signals Y1(1) and Y1(2) are actually separate signals, they are shown in FIG. 2 to be the same column selection signal Y1(j) for the sake of simplicity. The second data on the group of common data lines (DB1, *DB1) is amplified by a read amplifier and output to a read data line.

(t4)

At time t4, the chip select signal *CS, the row address strobe signal *RAS, the column address strobe signal *CAS and the address signals A11 and A10 go low, while the write enable signal *WE stays at a high level, thereby initiating an auto-refresh operation for BANK1. The precharge signal PR1 goes low, thereby releasing the precharge on the group of bit lines (B1, *B1) and the group of sense lines (S2, *S2) so that the group of bit lines (B1, *B1) starts floating.

The updated address output from a refresh counter 17 is input to the row address buffer 11, whereby the word line WL2 selected by the row decoder 12 goes high. The charges stored in the memory cell capacitors are transferred to the group of bit lines (B1, *B1) and the group of sense lines (S2, *S2), whereby a small potential difference occurs between the bit lines B1 and *B1 of the group of bit lines (B1, *B1) and between the sense line S2 and *S2 of the group of sense lines (S2, *S2).

On the other hand, the second data on the read data line is latched by a read latch, and then is output to the DQ output terminal. Simultaneously, the column address counter 27 counts up the column address so as to produce a third column address. Thus, a column selection signal Y1(3) selected by the third column address goes high, thereby transferring the third data on the third sense line to the group of common data lines (DB1, *DB1). Then, the column selection signal Y1(3) returns to a low level. The third data on the group of common data lines (DB1, *DB1) is amplified by a read amplifier and output to a read data line.

(t5)

The sense amplifier drive signal SE2 goes high, thereby activating a group of sense amplifiers 14. Thus, the data on the group of sense lines (S2, *S2) and the group of bit lines (B1, *B1) is fully swung and amplified by the group of sense amplifiers 14. The data is written in the memory cells along the word line WL2 and thus refreshed. The third data on the read data line is latched by a read latch, and then is output to the DQ output terminal. Simultaneously, the column address counter 27 counts up the column address so as to produce a fourth column address. Thus, a column selection signal Y1(4) selected by the fourth column address goes high, thereby transferring the fourth data on the fourth sense line to the group of common data lines (DB1, *DB1). Then, the column selection signal Y1(4) returns to a low level. The fourth data on the group of common data lines (DB1, *DB1) is amplified by a read amplifier and output to a read data line.

(t6)

The fourth data on the read data line is latched by a read latch, and then is output to the DQ output terminal. On the other hand, the word line WL2 goes low, and data on the group of bit lines (B1, *B1) is stored and held in the group of memory cells along the word line WL2. Then, the transfer gate signal TG1R goes low, and the group of bit lines (B1, *B1) and the group of sense lines (S2, *S2) are separated from each other.

The precharge signal PR1 is raised to a high level in order to precharge the group of bit lines in BANK1 in preparation for the next access to the memory cell array in BANK1. Thus, the group of bit lines (B1, *B1) is precharged to a potential of Vcc/2. Moreover, the sense enable signals SE1 and SE2 are dropped to a low level, so that the group of sense lines (S1, *S1) and the group of sense lines (S2, *S2) are floating. Moreover, the common data line precharge signal DBP1 goes high, thereby precharging the group of common data lines (DB1, *DB1).

(t7)

In preparation for an input of another row address in BANK1, the transfer gate signal TG1L is raised to a high level to precharge the group of sense lines (S1, *S1).

In the manner as described above, it is possible to perform a read operation simultaneously with an auto-refresh operation in BANK1. In the above-described example, the read operation is performed by the group of sense amplifiers 13 and the auto-refresh operation is performed by the group of sense amplifiers 14. Alternatively, the read operation may be performed by the group of sense amplifiers 14 and the auto-refresh operation may be performed by the group of sense amplifiers 13.

Figure 3:
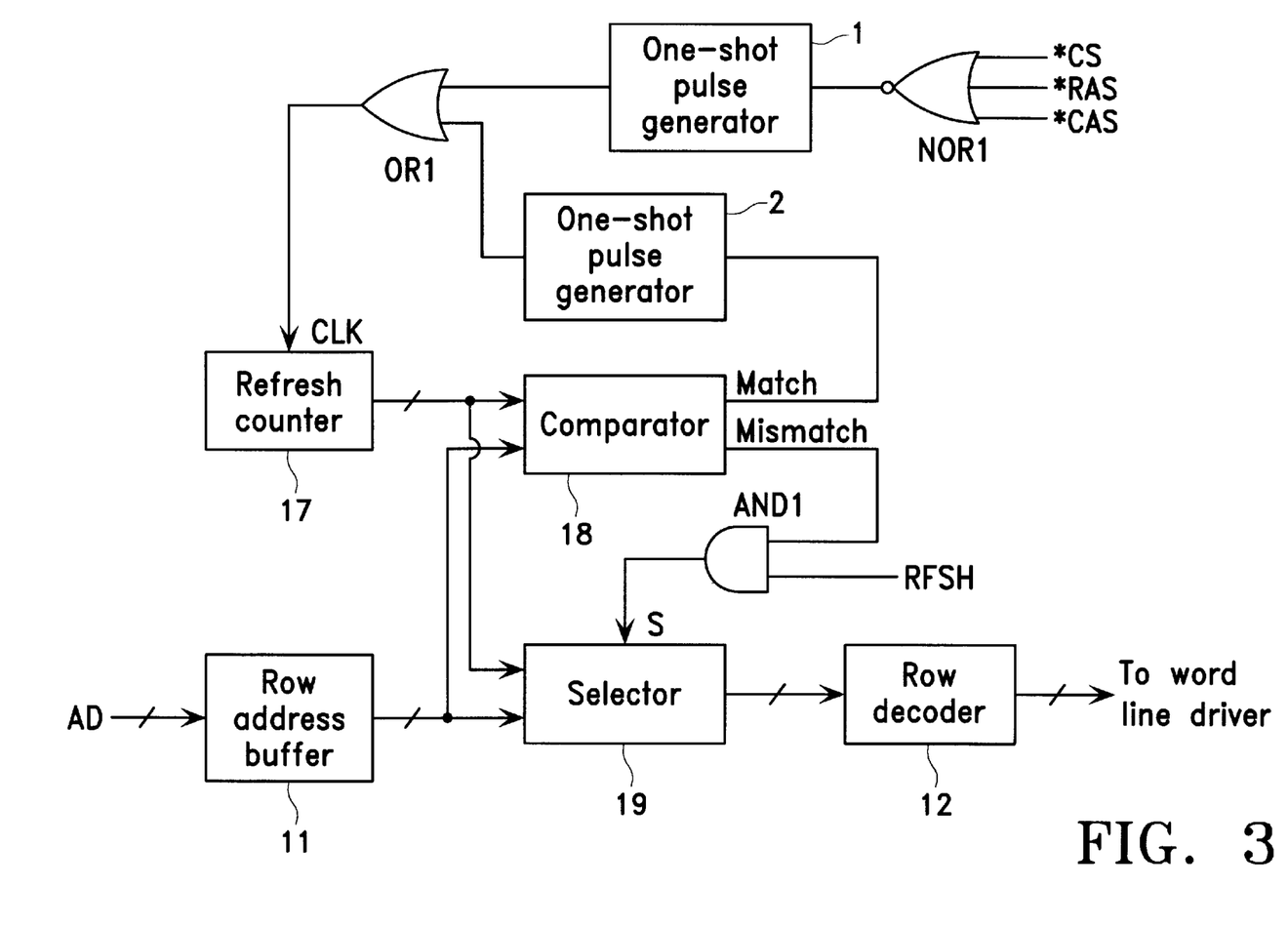
FIG. 3 is a block diagram illustrating a configuration of a row address selection circuit used in an example of the present invention.

The relationship between the word line WL1 involved in the read operation and the word line WL2 involved in the refresh operation will be briefly discussed below. When the output of the refresh counter 17, by chance, coincides with the input read row address AD, the memory cells along the row have been refreshed during the period t0–t2. Thus, the row of memory cells do not have to be refreshed again in response to the output from the refresh counter 17. In such a case, it would be desirable to be able to update the output of the refresh counter 17. FIG. 3 illustrates a configuration in which the output of the refresh counter 17 can be updated when the output coincides with the input read row address AD.

In FIG. 3, the refresh counter 17, the row address buffer 11 and the row decoder 12 are substantially the same as those illustrated in FIG. 1. A comparator 18 compares a multiple-bit output from the refresh counter 17 with a multiple-bit output from the row address buffer 11 so as to output "1" at its output terminal Match if the multiple-bit outputs coincide with each other, and output "1" at the other output terminal Mismatch thereof if the multiple-bit outputs do not coincide with each other. A selector 19 includes an input terminal S, and selects the output from the refresh counter 17 when the input at the terminal S is "1" and selects the output from the row address buffer 11 when the input at the terminal S is "0". Thus, the selector 19 passes the selected output to the row decoder 12.

Next, an operation of the configuration illustrated in the block diagram of FIG. 3 will be described.

During a read cycle, a signal RFSH is "0". Therefore, the input at the terminal S of the selector 19 is "0", whereby the output from the row address buffer 11 is passed to the row decoder 12, thereby activating the externally input row address. During the following refresh cycle, when all of the chip select signal *CS, the row address strobe signal *RAS and the column address strobe signal *CAS are "0", the output of an NOR gate NOR1 is "1", thereby outputting a positive pulse from a one-shot pulse generator 1. The positive pulse is input to an input terminal CLK of the refresh counter 17, thereby incrementing the refresh counter 17. The output from the refresh counter 17 and the output from the row address buffer 11 are compared with each other. When the outputs do not coincide with each other, the output of an AND gate AND1 is "1", whereby the selector 19 passes the output from the refresh counter 17 to the row decoder 12 so as to activate another row address different from the externally input row address. On the other hand, when the compared outputs coincide with each other, the output at the terminal Match of the comparator 18 is "1", thereby outputting a positive pulse from another one-shot pulse generator 2. The positive pulse is input to the input terminal CLK of the refresh counter 17, thereby incrementing the refresh counter 17 again. Thus, as the output from the refresh counter 17 and the output from the row address buffer 11 do not coincide with each other, the selector 19 passes the output from the refresh counter 17 to the row decoder 12, thereby activating the updated row address.

As described above, the present invention provides a semiconductor memory device in which it is possible to auto-refresh any row of data in a bank while reading out data from the same bank. Thus, in the semiconductor memory device of the present invention, it is possible to simultaneously perform an access operation and a refresh operation for the same bank, thereby improving the access efficiency of the memory as compared with that of a conventional synchronous semiconductor memory device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

a plurality of memory cells;

a plurality of word lines controlled by an output of a row decoder for selecting some of the plurality of memory cells;

a plurality of bit line groups for transferring data read out from the memory cells which are simultaneously selected by each of the plurality of word lines;

a plurality of first sense line groups connected respectively to the plurality of bit line groups via a first switch section;

a plurality of second sense line groups connected respectively to the plurality of bit line groups via a second switch section;

a plurality of first sense amplifiers connected respectively to the plurality of first sense line groups;

a plurality of second sense amplifiers connected respectively to the plurality of second sense line groups;

a plurality of third switch sections which are connected respectively to the plurality of first sense line groups and controlled by an output of a column decoder;

a first common data line connected to the plurality of third switch sections;

an input/output circuit connected to the first common data line for inputting/outputting data from/to an external unit; and a control circuit for controlling the plurality of third switch sections so as to transfer data latched by the plurality of first sense amplifiers to the input/output circuit via the first common data line, wherein:

a read operation is performed by activating a first word line of the plurality of word lines, transferring data read out from the memory cells simultaneously selected by the first word line via the plurality of bit line groups, latching the data from the plurality of bit line groups in the plurality of first sense amplifiers via the first switch section, transferring data from one of the plurality of first sense amplifiers to the first common data line via one of the plurality of third switch sections, and outputting the data from the first common data line to an external unit; and a refresh operation is performed, simultaneously with the read operation, by activating a second word line of the plurality of word lines, and refreshing data read out from the memory cells simultaneously selected by the second word line using the plurality of second sense amplifiers via the second switch section.

2. A semiconductor memory device according to claim 1, wherein:

the first switch section is conductive and the second switch section is non-conductive at a point in time when the first word line is selected;

after the first word line is selected, only the plurality of first sense amplifiers are activated which are connected to the plurality of first sense line groups connected to the plurality of bit line groups via the first switch section being conductive so as to amplify a potential difference between the plurality of first sense line groups and the bit line groups, thereby latching data in the plurality of first sense amplifiers;

while the data is latched in the plurality of first sense amplifiers, the first word line is unselected and data is re-written in the memory cells, the first switch section and the second switch section are turned to be non-conductive, the plurality of bit line groups separated from the plurality of first sense amplifiers and the plurality of second sense amplifiers are precharged, and the data is read out from the plurality of first sense amplifiers to the first common data line via the plurality of third switch sections, thus performing a read operation;

simultaneously with the read operation, the second switch section is turned to be conductive and a precharge circuit coupled to the bit line groups is activated so as to automatically precharge the plurality of bit line groups and the plurality of second sense line groups connected to the bit line groups; and at a point in time when the second word line is selected, the first switch section is non-conductive and the second switch section is turned to be conductive, so that a potential difference between the plurality of first sense line groups connected to the second switch section and the bit line groups is amplified by the plurality of second sense amplifiers, thereby re-writing the data in the memory cells, after which the second word line is unselected.

3. A semiconductor memory device according to claim 1, further comprising an internal refresh counter for outputting a refresh address, wherein:

the first word line is selected based on an externally input row address; and the second word line is selected based on the refresh address output from the internal refresh counter.

4. A semiconductor memory device according to claim 3, wherein:

the externally input row address and the refresh address output from the internal refresh counter are compared with each other;

if the addresses do not coincide with each other, the second word line is selected based on the refresh address; and if the addresses coincide with each other, the refresh address is updated, and then the second word line is selected based on the updated refresh address.

5. A semiconductor memory device according to claim 1, wherein:

the plurality of second sense line groups are connected to the second common data line via a fourth switch section; and the semiconductor memory device further comprises a control circuit for controlling the fourth switch section so that data latched in the plurality of second sense amplifiers is output to the external unit via the second common data line.

* * * * *